United States Patent
Tsuji (10) Patent No.: US 9,963,782 B2
(45) Date of Patent: May 8, 2018

(54) SEMICONDUCTOR MANUFACTURING APPARATUS

(71) Applicant: ASM IP Holding B.V., Almere (NL)

(72) Inventor: Naoto Tsuji, Suginami-ku (JP)

(73) Assignee: ASM IP HOLDING B.V., Almere (NL)

( * ) Notice: Subject to any disclaimer, the term of this patent is extended or adjusted under 35 U.S.C. 154(b) by 438 days.

(21) Appl. No.: 14/621,167

(22) Filed: Feb. 12, 2015

(65) Prior Publication Data

US 2016/0237559 A1    Aug. 18, 2016

(51) Int. Cl.
*C23C 16/44*    (2006.01)
*H01J 37/32*    (2006.01)

(52) U.S. Cl.
CPC ...... *C23C 16/4412* (2013.01); *H01J 37/3244* (2013.01); *H01J 37/32091* (2013.01); *H01J 37/32834* (2013.01)

(58) Field of Classification Search
CPC ............ C23C 16/4412; H01J 37/32834; H01J 37/32091; H01J 37/3244
USPC ..................................... 156/345.29; 118/715
See application file for complete search history.

(56) References Cited

U.S. PATENT DOCUMENTS

| | | | |
|---|---|---|---|
| 4,282,267 A * | 8/1981 | Kuyel | B01J 19/126 204/192.32 |
| 5,891,350 A * | 4/1999 | Shan | H01J 37/32477 118/723 E |
| 6,221,782 B1 * | 4/2001 | Shan | H01J 37/32477 438/710 |
| 6,261,408 B1 * | 7/2001 | Schneider | C23C 16/4412 118/715 |
| 6,402,847 B1 * | 6/2002 | Takagi | C23C 16/4405 118/715 |
| 6,446,572 B1 * | 9/2002 | Brcka | C23C 14/32 118/723 AN |
| 6,513,452 B2 * | 2/2003 | Shan | H01J 37/32477 118/715 |
| 6,531,069 B1 * | 3/2003 | Srivastava | H01J 37/3244 118/723 R |
| 6,777,352 B2 * | 8/2004 | Tepman | C23C 16/4412 118/696 |
| 6,806,211 B2 * | 10/2004 | Shinriki | C23C 16/40 118/715 |
| 6,921,556 B2 * | 7/2005 | Shimizu | C23C 16/4409 427/248.1 |
| 6,972,055 B2 * | 12/2005 | Sferlazzo | C23C 16/45508 118/719 |
| 7,020,981 B2 * | 4/2006 | Shero | C23C 16/4412 118/715 |
| 7,153,542 B2 * | 12/2006 | Nguyen | H01L 21/67173 427/248.1 |
| 7,273,526 B2 * | 9/2007 | Shinriki | C23C 16/34 118/715 |

(Continued)

*Primary Examiner* — Rudy Zervigon
(74) *Attorney, Agent, or Firm* — Studebaker & Brackett PC (57) ABSTRACT

A semiconductor manufacturing apparatus includes a stage, and an exhaust duct having an annular passage surrounding a processing space over the stage, an annular slit through which a gas supplied to the processing space is led into the annular passage, and an exhaust port through which the gas in the annular passage is discharged to the outside, wherein the opening-area percentage of the slit is increased with increase in distance from the exhaust port.

12 Claims, 5 Drawing Sheets

(56) References Cited

U.S. PATENT DOCUMENTS

| | | | | |
|---|---|---|---|---|
| 7,408,225 | B2* | 8/2008 | Shinriki | C23C 16/34 257/359 |
| 7,648,610 | B2* | 1/2010 | Komiya | C23C 16/4412 118/715 |
| 7,749,326 | B2* | 7/2010 | Kim | C23C 16/45508 118/715 |
| 8,026,159 | B2* | 9/2011 | Horii | C23C 16/409 118/723 VE |
| 8,075,728 | B2* | 12/2011 | Balakrishna | H01J 7/32449 118/715 |
| 8,118,938 | B2* | 2/2012 | Carducci | H01J 37/32082 118/50 |
| 8,163,088 | B2* | 4/2012 | Lamouroux | C23C 16/045 118/715 |
| 8,257,499 | B2* | 9/2012 | Suzuki | C23C 16/45508 118/715 |
| 8,277,561 | B2* | 10/2012 | Kim | C23C 16/45508 118/715 |
| 8,282,768 | B1* | 10/2012 | Smargiassi | H01L 21/02203 156/345.33 |
| 8,298,338 | B2* | 10/2012 | Kim | C23C 16/4412 118/715 |
| 8,372,201 | B2* | 2/2013 | Provencher | C23C 16/45536 118/715 |
| 8,440,019 | B2* | 5/2013 | Carducci | H01J 37/32082 118/50 |
| 8,506,713 | B2* | 8/2013 | Takagi | C23C 16/409 118/715 |
| 8,518,210 | B2* | 8/2013 | Smargiassi | H01L 21/02203 156/345.33 |
| 8,617,347 | B2* | 12/2013 | Kim | C23C 16/4412 118/715 |
| 8,627,783 | B2* | 1/2014 | Fischer | H01J 37/32449 118/723 R |
| 8,632,634 | B2* | 1/2014 | Moriyama | C23C 16/4412 118/715 |
| 8,677,590 | B2* | 3/2014 | Hudson | H01J 37/32082 118/719 |
| 8,734,663 | B2* | 5/2014 | Smargiassi | H01L 21/02203 118/715 |
| 9,017,481 | B1* | 4/2015 | Pettinger | H01J 37/3244 118/715 |
| 9,028,648 | B1* | 5/2015 | Kamakura | C23C 16/4405 118/715 |
| 9,384,959 | B2* | 7/2016 | Smargiassi | H01L 21/02203 |
| 9,487,863 | B2* | 11/2016 | Matsui | C23C 16/4412 |
| 9,567,669 | B2* | 2/2017 | Cho | C23C 16/4412 |
| 9,673,092 | B2* | 6/2017 | Nakano | H01L 21/76879 |
| 9,732,421 | B2* | 8/2017 | Kamakura | C23C 16/4412 |
| 9,758,870 | B2* | 9/2017 | Je | H01L 21/67103 |
| 9,779,918 | B2* | 10/2017 | Lee | H01J 37/32834 |
| 9,885,112 | B2* | 2/2018 | Tsuji | C23C 16/4412 |
| 2003/0094135 | A1* | 5/2003 | Komiya | C23C 16/4412 118/715 |
| 2004/0071874 | A1* | 4/2004 | Shimizu | C23C 16/4409 427/248.1 |
| 2005/0098111 | A1* | 5/2005 | Shimizu | C23C 16/4409 118/715 |
| 2005/0208217 | A1* | 9/2005 | Shinriki | C23C 16/34 427/248.1 |
| 2006/0213438 | A1* | 9/2006 | Ishizaka | C23C 16/4404 118/715 |
| 2007/0221130 | A1* | 9/2007 | Nozawa | C23C 16/4401 118/719 |
| 2007/0259110 | A1* | 11/2007 | Mahajani | C23C 16/45508 427/248.1 |
| 2008/0069966 | A1* | 3/2008 | Otsuki | C23C 16/4404 427/453 |
| 2008/0152803 | A1* | 6/2008 | Lamouroux | C23C 16/045 427/248.1 |
| 2008/0318417 | A1* | 12/2008 | Shinriki | C23C 16/02 438/650 |
| 2009/0165713 | A1* | 7/2009 | Kim | C23C 16/4412 118/719 |
| 2009/0260569 | A1* | 10/2009 | Kim | C23C 16/45508 118/715 |
| 2010/0279008 | A1* | 11/2010 | Takagi | C23C 16/409 427/248.1 |
| 2011/0162580 | A1* | 7/2011 | Provencher | C23C 16/45536 118/715 |
| 2014/0331933 | A1* | 11/2014 | Yang | C23C 16/4412 118/729 |
| 2015/0110959 | A1* | 4/2015 | Ashizawa | C23C 16/34 427/255.391 |
| 2016/0083837 | A1* | 3/2016 | Narushima | C23C 16/4408 118/725 |
| 2016/0104602 | A1* | 4/2016 | Tokiwa | H01J 37/32449 438/706 |
| 2016/0153088 | A1* | 6/2016 | Tsuji | C23C 16/4412 118/728 |
| 2016/0194756 | A1* | 7/2016 | Lim | C23C 16/45512 118/715 |
| 2016/0237559 | A1* | 8/2016 | Tsuji | C23C 16/4412 |
| 2016/0284574 | A1* | 9/2016 | Smargiassi | H01L 21/02203 |
| 2016/0289831 | A1* | 10/2016 | Je | C23C 16/45565 |
| 2016/0319425 | A1* | 11/2016 | Du | C23C 16/4412 |
| 2016/0355928 | A1* | 12/2016 | Toriya | C23C 16/45544 |
| 2017/0051402 | A1* | 2/2017 | Mori | C23C 16/4412 |

* cited by examiner

SEMICONDUCTOR MANUFACTURING APPARATUS

BACKGROUND OF THE INVENTION

Field of the Invention

The present invention relates to a semiconductor manufacturing apparatus that subjects a substrate to gas-based processing.

Background Art

U.S. Pat. No. 6,921,556B2 discloses an exhaust duct through which a gas spent for film forming is discharged to the outside.

For example, on a film forming apparatus or an etcher, an exhaust duct is provided so as to surround a stage. A gas supplied onto the stage is radially diffused and taken in the exhaust duct. Preferably, the gas supplied onto the stage enters the exhaust duct radially and uniformly. In other words, for uniformly performing processing on a substrate on the stage with no location dependence, it is desirable that the gas flow rate at the edge of the stage is uniform.

However, the gas flow rate is increased in some location on the stage edge and is reduced in another location on the stage edge. Thus, there is a problem of the gas flow rate at the stage edge being not uniform. The seriousness of this problem is increased particularly when the pressure in the chamber is reduced to about 200 Pa while the amount of exhaust in the chamber is comparatively large.

SUMMARY OF THE INVENTION

The present invention has been achieved to solve the above-described problem, and an object of the present invention is to provide a semiconductor manufacturing apparatus capable of improving the uniformity of the gas flow rate at the stage edge.

The features and advantages of the present invention may be summarized as follows.

According to one aspect of the present invention, a semiconductor manufacturing apparatus includes a stage, and an exhaust duct having an annular passage surrounding a processing space over the stage, an annular slit through which a gas supplied to the processing space is led into the annular passage, and an exhaust port through which the gas in the annular passage is discharged to the outside, wherein the opening-area percentage of the slit is increased with increase in distance from the exhaust port.

Other and further objects, features and advantages of the invention will appear more fully from the following description.

DETAILED DESCRIPTION OF THE PREFERRED EMBODIMENTS

A semiconductor manufacturing apparatus according to an embodiment of the present invention will be described with reference to the drawings. Components identical or corresponding to each other are indicated by the same reference characters and repeated description of them is omitted in some cases.

First Embodiment

Figure 1:
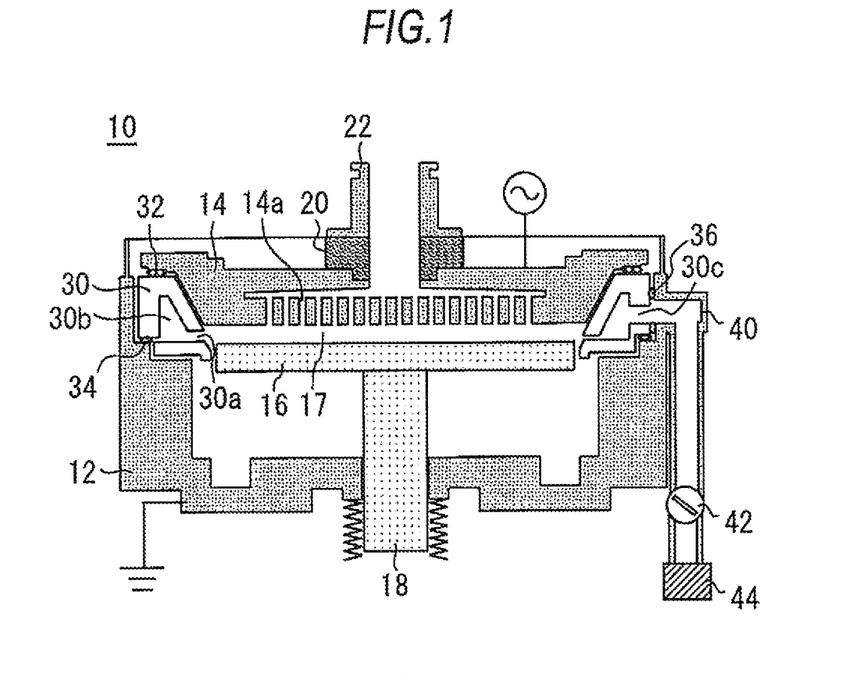
FIG. 1 is a sectional view of a semiconductor manufacturing apparatus according to a first embodiment.

FIG. 1 is a sectional view of a semiconductor manufacturing apparatus 10 according to a first embodiment of the present invention. The semiconductor manufacturing apparatus 10 is constructed as a film forming apparatus with which plasma enhanced atomic layer deposition (PEALD) for example is performed on a substrate. The semiconductor manufacturing apparatus 10 comprises a chamber (reactor chamber) 12. An RF electrode 14 to which RF power is applied is provided in the chamber 12. Holes 14a are formed in the RF electrode 14.

A stage 16 is provided in the chamber 12 so as to be opposed to the RF electrode 14. The stage 16 is a susceptor supported on a slide shaft 18. The RF electrode 14 and the stage 16 form a parallel flat plate structure.

A gas supply part 22 is connected to the RF electrode 14, with an insulating part 20 interposed therebetween. The gas supply part 22 is a part through which a material gas is supplied to a space between the RF electrode 14 and the stage 16. In a space over the stage 16, processing such as film forming is performed on a substrate placed on the stage 16. This space is therefore referred to as processing space 17.

An exhaust duct 30 is provided between the RF electrode 14 and the chamber 12. The exhaust duct 30 is formed of ceramic for example. An O-ring 32 suitably compressed is provided between the exhaust duct 30 and the RF electrode 14. An O-ring 34 suitably compressed is provided between the exhaust duct 30 and the chamber 12. An O-ring 36 suitably compressed is provided between the exhaust duct 30 and a gas exhaust part 40.

The exhaust duct 30 is formed so as to be annular as viewed in plan and surround the stage 16. With the exhaust duct 30, an annular passage 30b surrounding the processing space 17 over the stage 16 is provided. In the exhaust duct 30, an annular slit 30a through which a gas supplied into the processing space 17 is led into the annular passage 30b and an exhaust port 30c through which the gas in the annular passage 30b is discharged to the outside are formed.

The exhaust port 30c connects to the gas exhaust part 40 provided on a side surface of the chamber 12. The gas exhaust part 40 is provided for the purpose of discharging the material gas used for film forming. A valve 42 and a vacuum pump 44 are connected to the gas exhaust part 40. The pressure in the chamber 12 can be freely controlled by adjusting the amount of exhaust with the valve 42 and the vacuum pump 44.

Figure 2:
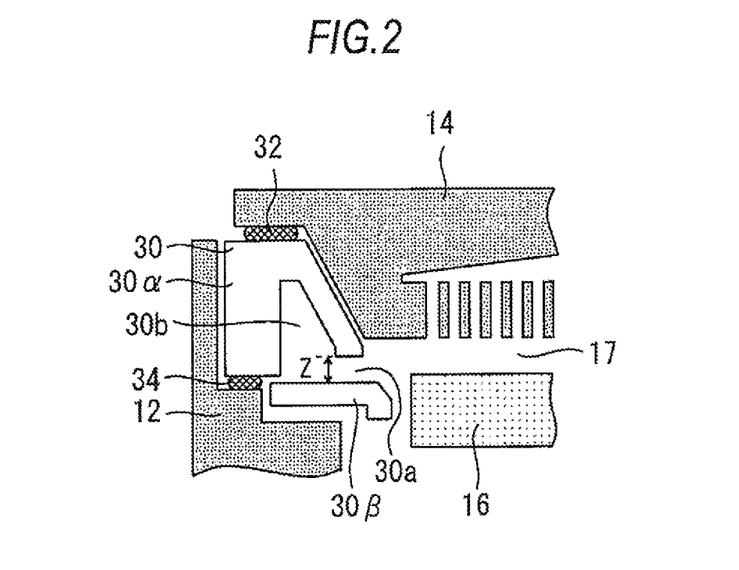
FIG. 2 is an enlarged view of the exhaust duct and other components.

FIG. 2 is an enlarged view of the exhaust duct 30 and other components. The exhaust duct has an upper part 30α and a lower part 30β. Z represents the extent of the slit 30a in the vertical direction. The facility with which the gas enters the annular passage 30b from the processing space 17 can be adjusted by adjusting the extent Z of the slit 30a. If the extent Z of the slit 30a is large, the material gas can easily flow into the annular passage 30b. If the extent Z of the slit 30a is small, the facility with which the material gas flows into the annular passage 30b is reduced.

Figure 3:
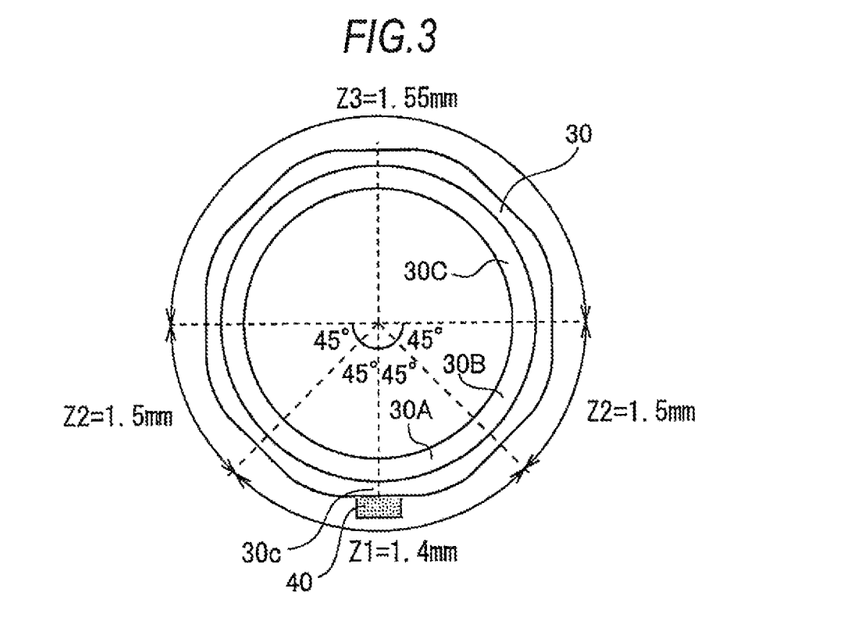
FIG. 3 is a plan view of the exhaust duct.

FIG. 3 is a plan view of the exhaust duct 30. The extent Z of the slit 30a in the vertical direction is increased stepwise with increase in distance from the exhaust port 30c. More specifically, the extent of the slit in the vertical direction in a region from the exhaust port 30c to a position reached by an advance in the circumferential direction by ⅛ of the entire circumference of the exhaust duct 30 (referred to as first region 30A) is a first extension Z1. That is, the extent of the slit in the vertical direction on the ¼ circular arc centered on the exhaust port 30c is Z1. Z1 is, for example, 1.4 mm.

The extent of the slit 30a in the vertical direction in a region from the position reached by the advance in the circumferential direction by ⅛ of the entire circumference of the exhaust duct 30 from the exhaust port 30c to a position reached by a further advance in the circumferential direction by ⅛ of the entire circumference of the exhaust duct 30 (referred to as second region 30B) is a second extension Z2. That is, the two ⅛ circular arcs between which the first region 30A is defined are the second region 30B. Z2 is, for example, 1.5 mm.

The extent of the slit 30a in the vertical direction in the portion (referred to as third region 30C) other than the portion formed with the first extent Z1 (first region 30A) and the portion formed with the second extent Z2 (second region 30B) is a third extent Z3. That is, the ½ circular arc at the farthermost position from the exhaust port 30c is the third region 30C. Z3 is, for example, 1.55 mm.

Figure 4:
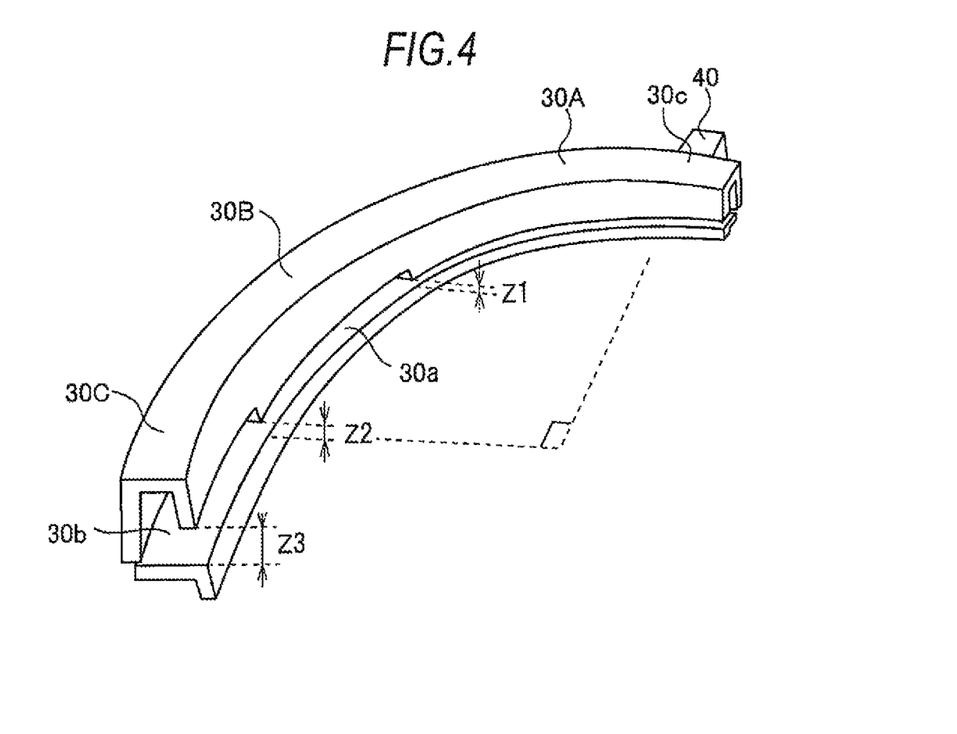
FIG. 4 is a perspective view of a portion of the exhaust duct.

FIG. 4 is a perspective view of a portion of the exhaust duct 30. In the first region 30A, the extent Z1 of the slit 30a in the vertical direction is 1.4 mm. In the second region 30B, the extent Z2 of the slit 30a in the vertical direction is 1.5 mm. In the third region 30C, the extent Z3 of the slit 30a in the vertical direction is 1.55 mm.

The operation of the semiconductor manufacturing apparatus 10 according to the first embodiment will now be described. A material gas is supplied into the processing space 17 through the holes 14a in the RF electrode 14 shown in FIG. 1. Plasma of the material gas is produced by the electric field between the RF electrode 14 and the stage 16 between which electric power is applied, thereby performing plasma film forming on a substrate on the stage 16. The material gas used for film forming spreads radially as viewed in plan and enters the annular passage 30b via the slit 30a of the exhaust duct 30. The gas in the annular passage 30b is discharged from the exhaust port 30c to the outside.

In the case where the extent in the vertical direction of the slit 30a in annular form is uniform, a larger amount of gas flows through a portion of the slit 30a closer to the exhaust port 30c while a smaller amount of gas flows through a portion farther from the exhaust port 30c. Non-uniformity of the gas flow rate at the edge of the stage 16 (stage edge) thus occurs. More specifically, the gas flow rate is increased at a portion of the stage edge closer to the exhaust port 30c while the gas flow rate is reduced at a portion farther from the exhaust port 30c.

In the first embodiment of the present invention, the extent in the vertical direction of the slit 30a of the exhaust duct 30 is increased with increase in distance from the exhaust port 30c. With the slit 30a thus formed, the gas flow rate at a portion of the stage edge closer to the exhaust port 30C is suppressed and the gas flow rate at a portion of the stage edge farther from the exhaust port 30c is increased. The uniformity of the gas flow rate at the stage edge can therefore be improved. Thus, variations in the effects of film forming in the substrate surface area can be reduced by making the exhaust conductance at the stage edge generally uniform.

The semiconductor manufacturing apparatus 10 according to the first embodiment of the present invention can be variously modified. In the semiconductor manufacturing apparatus 10, the first extent Z1 is set smaller than the second extent Z2, and the second extent Z2 is set smaller than the third extent Z3, thereby improving the uniformity of the gas flow rate at the stage edge. The actual size values Z1, Z2 and Z3 can be variously changed as desired.

While the extent of the slit 30a in the vertical direction is changed in three steps (Z1, Z2, Z3), the number of steps is not limited to three as long as the extent is changed in two or more steps. The semiconductor manufacturing apparatus 10 is characterized by the shape of the exhaust duct 30. The present invention can therefore be applied to various semiconductor manufacturing apparatuses with exhaust ducts. More specifically, the exhaust duct of the present invention can be utilized in semiconductor manufacturing apparatuses such as etchers as well as film forming apparatuses.

These modifications can be applied as desired to semiconductor manufacturing apparatuses according to embodiments described below. Each of the semiconductor manufacturing apparatuses according to the embodiments described below has a number of commonalities with the first embodiments and will therefore be described mainly with respect to points of difference from the first embodiment.

Second Embodiment

Figure 5:
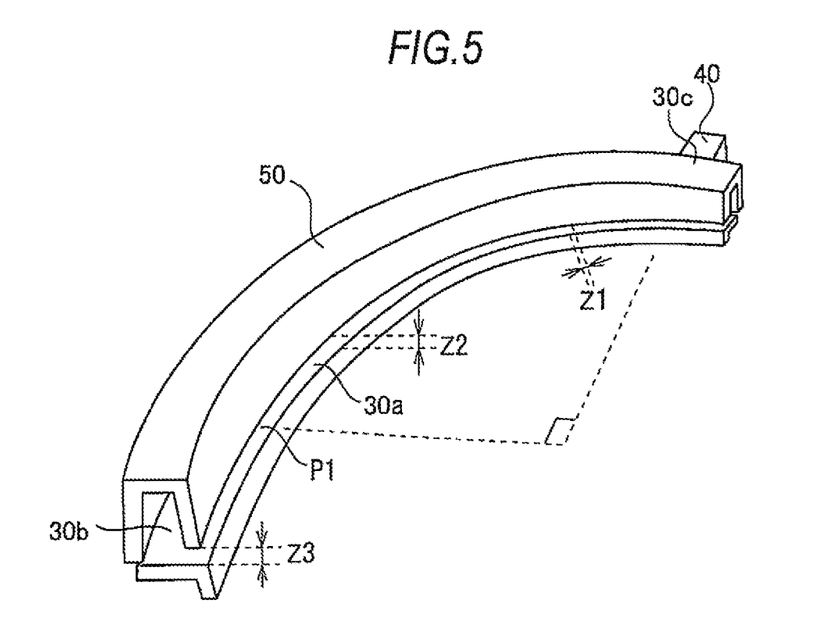
FIG. 5 is a perspective view of a portion of an exhaust duct of the semiconductor manufacturing apparatus according to the second embodiment.

FIG. 5 is a perspective view of a portion of an exhaust duct 50 of the semiconductor manufacturing apparatus according to the second embodiment of the present invention. The extent Z of the slit 30a in the vertical direction is increased steplessly with increase in distance from the exhaust port 30c. Accordingly, the extent Z of the slit 30a in the vertical direction is minimized in its portion at which the exhaust port 30c is formed, and is maximized in its portion farthermost from the exhaust port 30c.

With this slit shape, the flow of gas from a position in the processing space close to the exhaust port 30c to the annular passage 30b is suppressed and the flow of gas from a position in the processing space remote from the exhaust port 30c is promoted, thus improving the uniformity of the gas flow rate at the stage edge.

In the meantime, in the exhaust duct 50 according to the second embodiment, the gas flow rate is higher at a position P1 in the slit 30a reached by an advance in the circumferential direction by ¼ of the entire circumference of the exhaust duct 30 from the exhaust port 30c than at any other position. The effect of improving the uniformity of the gas flow rate at the stage edge is therefore limited.

It is preferable to increase the extent of the slit 30a in the vertical direction nonlinearly and steplessly with increase in distance from the exhaust port 30c in order to suppress the extent of the slit 30a in the vertical direction at the position P1. For example, the rate of increase in the extent of the slit 30a in the vertical direction from the location where the exhaust port 30c exists to the position P1 is set smaller than the rate of increase in the extent of the slit 30a in the vertical direction in the farther location. The slit shape in such a case can be realized by changing the extent of the slit 30a in the vertical direction according to a quadratic function. Needless to say, the degree of the function determining the change may be increased.

In the second embodiment of the present invention, the extent Z of the slit 30a in the vertical direction is changed through the entire exhaust duct 30 in annular form. However, the arrangement may be such that the extent Z is changed in a portion from the position at which the exhaust port 30c exits to a predetermined position and is made constant in the other portion.

Third Embodiment

Figure 6:
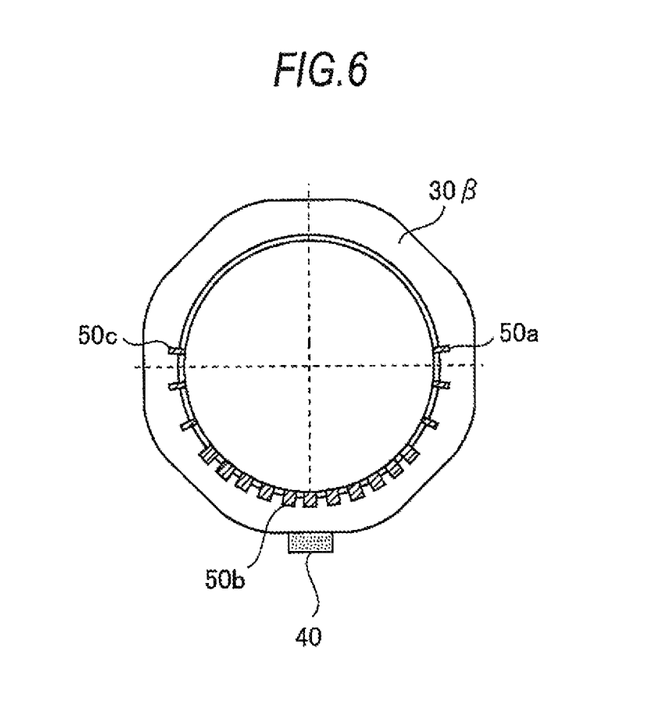
FIG. 6 is a plan view of the lower part.

FIG. 6 is a plan view of the lower part 30β of the exhaust duct of the semiconductor manufacturing apparatus according to the third embodiment of the present invention. In this exhaust duct, portions of the slit are blocked with a plurality of obstacles. FIG. 6 illustrates the lower part 30β and a plurality of obstacles. As the plurality of obstacles, three obstacles 50a, eleven obstacles 50b and three obstacles 50c are provided. The obstacles 50b are formed near the exhaust port 30c. The obstacles 50a and the obstacles 50c are provided at positions between which the obstacles 50b are located.

Each of the three obstacles 50a and the three obstacles 50c is an obstacle of a comparatively small width. The eleven obstacles are each an obstacle of a width about twice that of the obstacles 50a and 50c. The obstacles 50b are provided at a density twice the density at which the obstacles 50a and 50c are provided. Consequently, the plurality of obstacles block portions of the slit in such a manner that the slit opening-area percentage is increased with increase in distance from the exhaust port 30c.

Figure 7:
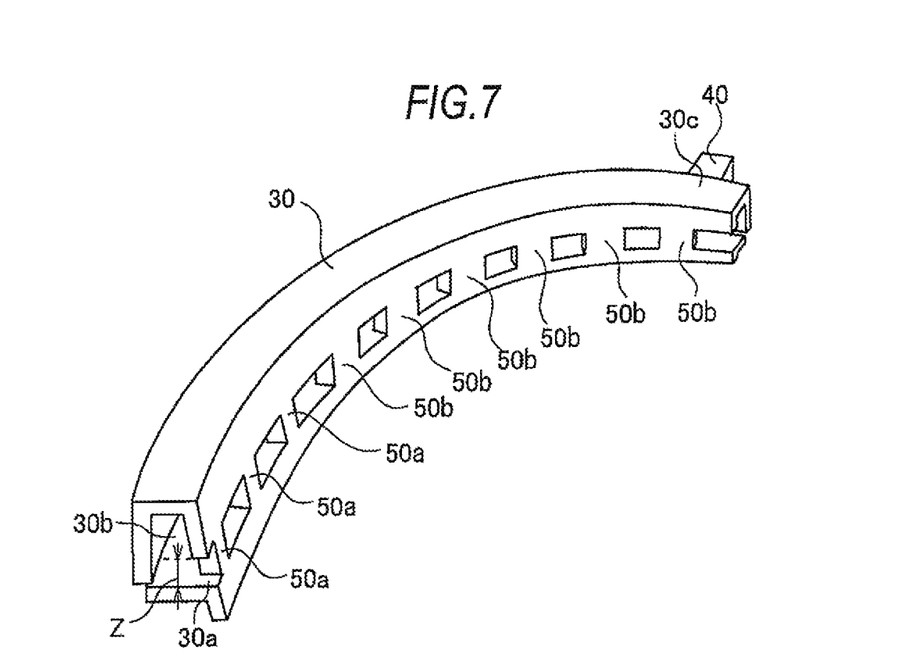
FIG. 7 is a perspective view of a portion of the exhaust duct of the semiconductor manufacturing apparatus according to the third embodiment.

FIG. 7 is a perspective view of a portion of the exhaust duct of the semiconductor manufacturing apparatus according to the third embodiment of the present invention. The extent Z of the slit 30a in the vertical direction is 1.55 mm and fixed at this value. The width of the obstacles 50a is 1.5 mm. The extent of the obstacles 50a in the longitudinal direction (the direction from the processing space toward the annular passage 30b) is 8 mm. The obstacles 50c are identical in shape to the obstacles 50a.

The width of the obstacles 50b is 3 mm. The extent of the obstacles 50b in the longitudinal direction (the direction from the processing space toward the annular passage 30b) is 8 mm.

The extent of the plurality of obstacles in the vertical direction is equal to the extent of the slit 30a in the vertical direction, which is 1.55 mm. Accordingly, the upper ends and the lower ends of the plurality of obstacles are connected to the exhaust duct 30. The plurality of obstacles may be parts provided separately from the exhaust duct 30 or may be formed integrally with the exhaust duct 30.

As shown in FIG. 6, the density and the width of the plurality of obstacles are set higher and larger in a location closer to the exhaust port 30c than in a location farther from the exhaust port 30c, thereby making the opening-area percentage of the slit 30a substantially equal to that of the slit 30a in the first embodiment. The uniformity of the gas flow rate at the stage edge can thus be improved.

Figure 8:
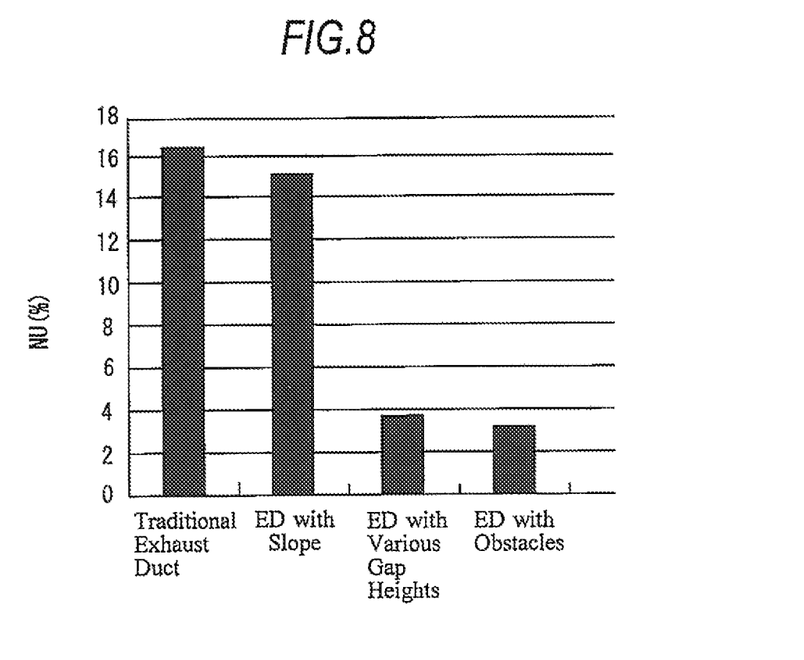
FIG. 8 shows simulation results.

FIG. 8 shows simulation results showing the relationship between the slit shape of the exhaust duct and non-uniformity (NU) of the gas flow rate at the stage edge. Non-uniformity (NU) of the gas flow rate at the stage edge can be expressed by $((Vmax-Vmin)/Vave) \times 100$ where Vmax is the maximum of the gas flow rate at the stage edge; Vmin is the minimum of the gas flow rate at the stage edge; and Vave is the average of the gas flow rate at the stage edge.

"Traditional Exhaust Duct" designates an exhaust duct in which the extent of the slit in the vertical direction is uniform. A concrete value of the extent of the slit in the vertical direction is 1.5 mm "ED with Slope" designates the exhaust duct according to the second embodiment (FIG. 5). "ED with Various Gap Heights" designates the exhaust duct according to the first embodiment (FIGS. 3 and 4). "ED with Obstacles" designates the exhaust duct according to the third embodiment (FIGS. 6 and 7).

In the case of "Traditional Exhaust Duct", non-uniformity (NU) is as high as 16.3%. In the case of "ED with Slope", non-uniformity is slightly improved in comparison with that in the case of "Traditional Exhaust Duct". In the case of "ED with Various Gap Heights", a markedly improved value of non-uniformity as low as 3.7% is exhibited. Also in the case of "ED with Obstacles", a markedly improved value of non-uniformity as low as 3.2% is exhibited.

The plurality of obstacles according to the third embodiment of the present invention are provided for the purpose of adjusting the opening-area percentage of slit 30a. Therefore, the width and density of the obstacles may be appropriately changed.

Fourth Embodiment

Figure 9:
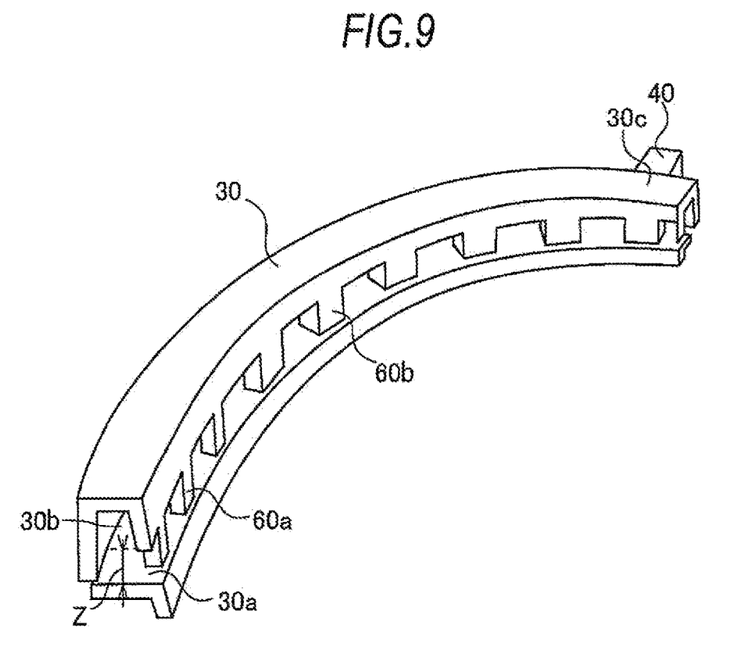
FIG. 9 is a perspective view of a portion of the exhaust duct according to the fourth embodiment.

The semiconductor manufacturing apparatus according to the fourth embodiment will be described mainly with respect to points of difference from the semiconductor manufacturing apparatus according to the third embodiment. FIG. 9 is a perspective view of a portion of the exhaust duct according to the fourth embodiment. A plurality of obstacles: obstacles 60a of a smaller width and obstacles 60b of a larger width are provided. The plurality of obstacles are joined to the exhaust duct 30 only at their upper ends. The opening-area percentage of slit 30a can be adjusted by adjusting the gaps between the lower ends of the plurality of obstacles and the exhaust duct 30.

Fifth Embodiment

Figure 10:
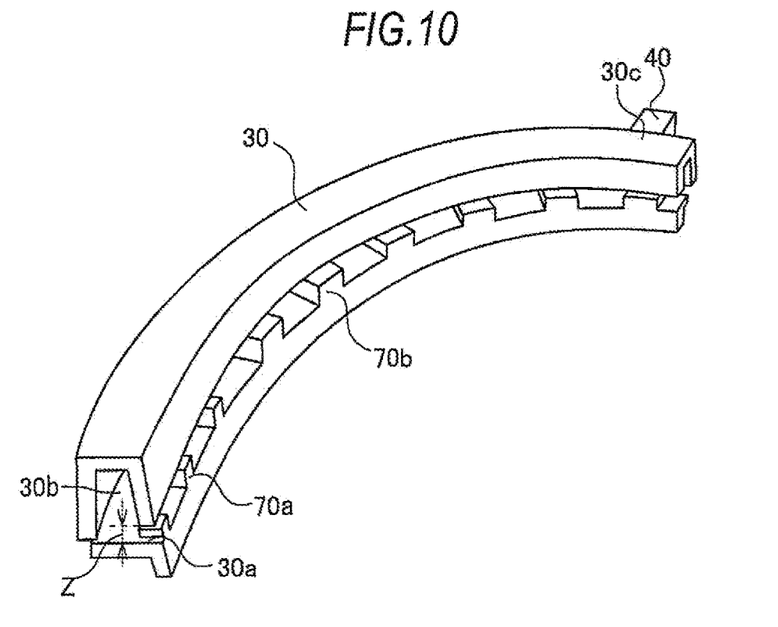
FIG. 10 is a perspective view of a portion of the exhaust duct according to the fifth embodiment.

The semiconductor manufacturing apparatus according to the fifth embodiment will be described mainly with respect to points of difference from the semiconductor manufacturing apparatus according to the third embodiment. FIG. 10 is a perspective view of a portion of the exhaust duct according to the fifth embodiment. A plurality of obstacles: obstacles 70a of a smaller width and obstacles 70b of a larger width are provided. The plurality of obstacles are joined to the exhaust duct 30 only at their lower ends. The opening-area percentage of slit 30a can be adjusted by adjusting the gaps between the upper ends of the plurality of obstacles and the exhaust duct 30.

Each of the slits 30a of the semiconductor manufacturing apparatuses of the present invention described above can be changed in shape appropriately as long as the opening-area percentage of the slit 30a is increased with increase in distance from the exhaust port. A combination of some of the features of the semiconductor manufacturing apparatuses according to the embodiments can be appropriately made.

According to the present invention, the opening-area percentage of a slit of the exhaust duct is increased with increase in distance from the exhaust port. The uniformity of the gas flow rate at the stage edge can thereby be improved.

Obviously many modifications and variations of the present invention are possible in the light of the above teachings. It is therefore to be understood that within the scope of the appended claims the invention may be practiced otherwise than as specifically described.

What is claimed is:

1. A semiconductor manufacturing apparatus comprising:
   a stage; and
   an exhaust duct having an annular passage surrounding a processing space, the processing space being over the stage, an annular slit through which a gas supplied to the processing space is led into the annular passage, and an exhaust port through which the gas in the annular passage is discharged to the outside, wherein
   the opening-area percentage of the slit is increased with increase in distance from the exhaust port,
   the stage is separated from the exhaust duct, and
   the rate of increase in the extent of the slit in the vertical direction from the location where the exhaust port exists to a predetermined position is set smaller than the rate of increase in the extent of the slit in the vertical direction in a farther location.

2. The semiconductor manufacturing apparatus according to claim 1, wherein the extent of the slit in the vertical direction is increased stepwise with increase in distance from the exhaust port.

3. The semiconductor manufacturing apparatus according to claim 2, wherein the extent of the slit in the vertical direction is:
   a first extent in a region from the exhaust port to a position reached by an advance in the circumferential direction by ⅛ of the entire circumference of the exhaust duct;
   a second extent in a region from the position reached by the advance in the circumferential direction by ⅛ of the entire circumference of the exhaust duct from the exhaust port to a position reached by a further advance in the circumferential direction by ⅛ of the entire circumference of the exhaust duct; and
   a third extent in a portion other than the portion formed with the first extent and the portion formed with the second extent, and
   wherein the first extent is smaller than the second extent, and the second extent is smaller than the third extent.

4. The semiconductor manufacturing apparatus according to claim 1, wherein the extent of the slit in the vertical direction is steplessly increased with increase in distance from the exhaust port.

5. The semiconductor manufacturing apparatus according to claim 1, wherein the extent of the slit in the vertical direction is nonlinearly and steplessly increased with increase in distance from the exhaust port.

6. The semiconductor manufacturing apparatus according to claim 1, comprising a plurality of obstacles with which portions of the slit are blocked so that the opening-area percentage of the slit is increased with increase in distance from the exhaust port.

7. The semiconductor manufacturing apparatus according to claim 6, wherein the density and the width of the plurality of obstacles are set higher and larger in a location closer to the exhaust port than in a location farther from the exhaust port.

8. The semiconductor manufacturing apparatus according to claim 6, wherein the extent of the plurality of obstacles in the vertical direction is equal to the extent of the slit in the vertical direction.

9. The semiconductor manufacturing apparatus according to claim 6, wherein the plurality of obstacles are joined to the exhaust duct only at their upper ends.

10. The semiconductor manufacturing apparatus according to claim 6, wherein the plurality of obstacles are joined to the exhaust duct only at their lower ends.

11. The semiconductor manufacturing apparatus according to claim 6, wherein the plurality of obstacles are formed integrally with the exhaust duct.

12. The semiconductor manufacturing apparatus according to claim 1, wherein the exhaust duct is formed of ceramic.

* * * * *